(12) United States Patent
Oh et al.

(10) Patent No.: US 9,530,849 B2
(45) Date of Patent: Dec. 27, 2016

(54) TRANSISTOR HAVING DUAL WORK FUNCTION BURIED GATE ELECTRODE AND METHOD FOR FABRICATING THE SAME

(71) Applicant: SK hynix Inc., Gyeonggi-do (KR)

(72) Inventors: Tae-Kyung Oh, Gyeonggi-do (KR); Su-Ho Kim, Gyeonggi-do (KR); Jin-Yul Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/322,730

(22) Filed: Jul. 2, 2014

(65) Prior Publication Data
US 2015/0214313 A1 Jul. 30, 2015

(30) Foreign Application Priority Data

Jan. 29, 2014 (KR) ........................ 10-2014-0011584

(51) Int. Cl.
| | |
|---|---|
| *H01L 29/41* | (2006.01) |
| *H01L 29/43* | (2006.01) |
| *H01L 29/423* | (2006.01) |
| *H01L 29/66* | (2006.01) |
| *H01L 29/78* | (2006.01) |
| *H01L 27/22* | (2006.01) |
| *H01L 27/24* | (2006.01) |
| *H01L 29/49* | (2006.01) |
| *H01L 27/108* | (2006.01) |
| *H01L 45/00* | (2006.01) |

(52) U.S. Cl.
CPC ..... *H01L 29/4236* (2013.01); *H01L 27/10876* (2013.01); *H01L 27/10885* (2013.01); *H01L 27/228* (2013.01); *H01L 27/2436* (2013.01); *H01L 29/4983* (2013.01); *H01L 29/66666* (2013.01); *H01L 29/7827* (2013.01); *H01L 45/06* (2013.01); *H01L 45/1233* (2013.01); *H01L 45/146* (2013.01)

(58) Field of Classification Search
CPC ........... H01L 29/4236; H01L 21/28008; H01L 27/108
See application file for complete search history.

(56) References Cited

U.S. PATENT DOCUMENTS

| | | | |
|---|---|---|---|
| 6,667,503 | B2 | 12/2003 | Koike et al. |
| 8,034,701 | B2 | 10/2011 | Lee et al. |
| 8,058,687 | B2 | 11/2011 | Tai et al. |

(Continued)

FOREIGN PATENT DOCUMENTS

KR   101128903   3/2012

*Primary Examiner* — Marc Armand
*Assistant Examiner* — Sarah Salerno
(74) *Attorney, Agent, or Firm* — I P & T Group LLP

(57) ABSTRACT

A transistor having a source region and a drain region which are separately formed in a substrate, a trench which is defined in the substrate between the source region and the drain region, and a gate electrode which is formed in the trench. The gate electrode includes a first electrode buried over a bottom of the trench; a second electrode formed over the first electrode; and a liner electrode having an interface part which is positioned between the first electrode and the second electrode and a side part, which is positioned on sidewalls of the second electrode and overlaps with the source region and the drain region.

11 Claims, 15 Drawing Sheets

(56) References Cited

U.S. PATENT DOCUMENTS

| | | | |
|---|---|---|---|
| 2008/0211057 A1* | 9/2008 | Lee | H01L 27/10891 |
| | | | 257/520 |
| 2012/0043614 A1* | 2/2012 | Choi | H01L 28/20 |
| | | | 257/369 |
| 2012/0086074 A1* | 4/2012 | Hwang | H01L 27/10876 |
| | | | 257/334 |
| 2012/0168859 A1* | 7/2012 | Jin | H01L 29/407 |
| | | | 257/330 |
| 2014/0061781 A1* | 3/2014 | Kim | H01L 27/10876 |
| | | | 257/331 |
| 2014/0159145 A1* | 6/2014 | Park | H01L 29/66621 |
| | | | 257/330 |

* cited by examiner

TRANSISTOR HAVING DUAL WORK FUNCTION BURIED GATE ELECTRODE AND METHOD FOR FABRICATING THE SAME

CROSS-REFERENCE TO RELATED APPLICATIONS

The present application claims priority of Korean Patent Application No. 10-2014-0011584, filed on Jan. 29, 2014, which is incorporated herein by reference in its entirety.

BACKGROUND

1. Field

Exemplary embodiments of the present invention relate to a transistor, and more particularly, to a transistor having a dual work function buried gate electrode and a method for fabricating the same.

2. Description of the Related Art

A metal gate electrode may be applied as the gate electrode of a transistor. Gate resistance may be decreased by a metal gate electrode that has a low resistance. Additionally, since the metal gate electrode may have a high work function, the channel dose may be decreased resulting in a reduction of leakage current and improved transistor performance.

However, a concern is likely to be caused due to the high work function, since gate-induced drain leakage (GIDL) increases where the metal gate electrode and junction regions overlap, in the source/drain regions. Particularly, in a buried gate type transistor, since the overlap area between a buried metal gate electrode and source/drain regions is large, gate-induced drain leakage (GIDL) may be an issue.

To reduce gate-induced drain leakage (GIDL), the height of the buried metal gate electrode may be lowered and the overlap area between the buried metal gate electrode and the source/drain regions may be minimized.

Nevertheless, if the height of the buried metal gate electrode is lowered, there is a concern that gate resistance increases and the current drivability of the transistor is degraded.

Hence, an improved trade-off characteristic between gate-induced drain leakage (GIDL) and current drivability is in demand.

SUMMARY

Various embodiments of the present invention are directed to a buried gate type transistor and a method for fabricating the same, for reducing gate-induced drain leakage and improving current drivability.

In an embodiment of the present invention, a transistor may include a source region and a drain region which are separately formed in a substrate, a trench which is defined in the substrate between the source region and the drain region, and a gate electrode which is formed in the trench, the gate electrode including: a first electrode buried over a bottom of the trench; a second electrode formed over the first electrode; and a liner electrode having an interface part, which is positioned between the first electrode and the second electrode and a side part which is positioned on sidewalls of the second electrode and overlaps with the source region and the drain region.

In another embodiment of the present invention, a transistor may include: an isolation layer formed in a substrate, and defining an active region; a source region and a drain region formed in the active region, and separated from each other; a trench defined in the active region between the source region and the drain region, and extending into the isolation layer; a fin region formed in the active region under the trench; and a gate electrode covering the fin region, and positioned in the trench, the gate electrode including: a first electrode covering a top and sidewalls of the fin region, and buried under the trench; a second electrode over the first electrode; a liner electrode having an interface part which is positioned between the first electrode and the second electrode and a side part which is positioned on sidewalls of the second electrode and overlaps with the source region and the drain region; and a barrier layer between the liner electrode and the second electrode.

In another embodiment of the present invention, a method for fabricating a transistor may include: defining a trench in a substrate; forming a first conductive layer, which has a first work function and gapfills the trench; removing the first conductive layer from a top surface of the substrate to form a first electrode, which partially gapfills the trench; forming a second conductive layer, which has a second work function lower than the first work function, on a top surface of the first electrode, sidewalls of the trench and the top surface of the substrate; forming a barrier layer over the second conductive layer; forming a low resistance layer over the barrier layer to gapfill the trench; removing the low resistance layer, the barrier layer and the second conductive layer from the top surface of the substrate to form a second electrode and a liner electrode; and forming a source region and a drain region in the substrate, which are separated from each other by the trench and have a depth overlapping with the liner electrode.

In another embodiment of the present invention, an electronic device may include at least one buried gate type transistor, the buried gate type transistor including a source region and a drain region, a trench between the source region and the drain region, and a gate electrode in the trench, the gate electrode including: a first work function layer buried in a lower portion of the trench; a low resistance layer buried over the first work function layer; a second work function layer having a work function lower than the first work function layer and including an interface part between the first work function layer and the low resistance layer and a side part which is positioned on sidewalls of the low resistance layer and overlaps with the source region and the drain region; and a barrier layer between the second work function layer and the low resistance layer.

In another embodiment of the present invention, a semiconductor device may include at least one buried gate type transistor, the buried gate type transistor including a source region and a drain region, a trench between the source region and the drain region, and a gate electrode in the trench, the gate electrode including: a first work function layer buried in a lower portion of the trench; a low resistance layer buried over the first work function layer; a second work function layer having a work function lower than the first work function layer and including an interface part between the first work function layer and the low resistance layer and a side part which is positioned on sidewalls of the low resistance layer and overlaps with the source region and the drain region; and a barrier layer between the second work function layer and the low resistance layer.

In another embodiment of the present invention, an integrated circuit may include at least one buried gate type N-channel transistor, the buried gate type N-channel transistor including a source region and a drain region, a trench between the source region and the drain region, and a gate electrode in the trench, the gate electrode including: a first work function layer buried in a lower portion of the trench; a low resistance layer buried over the first work function layer; a second work function layer having a work function lower than the first work function layer and including an interface part between the first work function layer and the low resistance layer and a side part which is positioned on sidewalls of the low resistance layer and overlaps with the source region and the drain region; and a barrier layer between the second work function layer and the low resistance layer.

In another embodiment of the present invention, a memory cell may include a buried gate type transistor, the buried gate type transistor including a source region and a drain region, a trench between the source region and the drain region, and a gate electrode in the trench, the gate electrode including: a first work function layer buried in a lower portion of the trench; a low resistance layer buried over the first work function layer; a second work function layer having a work function lower than the first work function layer and including an interface part between the first work function layer and the low resistance layer and a side part which is positioned on sidewalls of the low resistance layer and overlaps with the source region and the drain region; and a barrier layer between the second work function layer and the low resistance layer.

DETAILED DESCRIPTION

Figure 1:
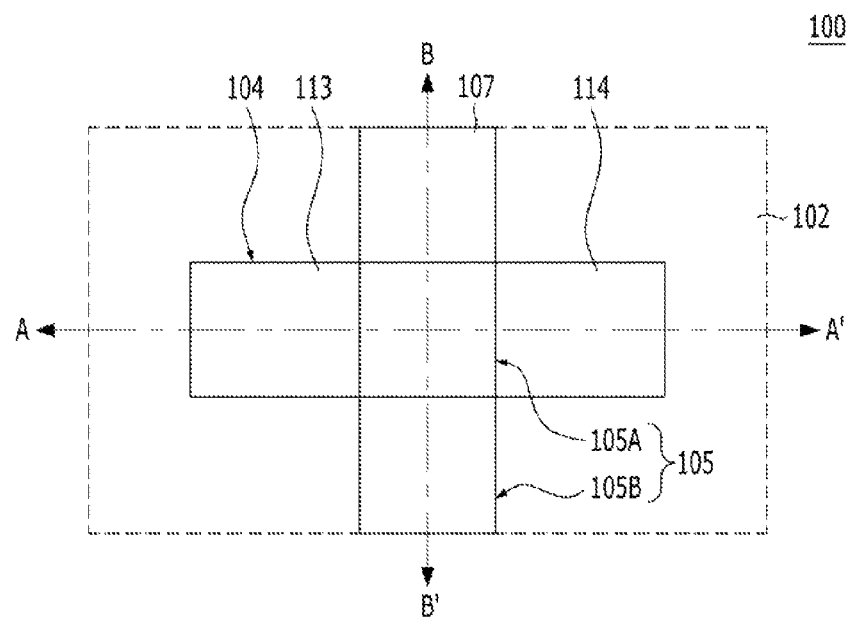
FIG. 1 is a plan view illustrating a transistor in accordance with a first embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Also, it is noted that in this specification, "connected/coupled" refers to one component not only directly coupling another component but also indirectly coupling another component through an intermediate component. In addition, a singular form may include a plural form, and vice versa, as long as it is not specifically mentioned.

Figure 2A:
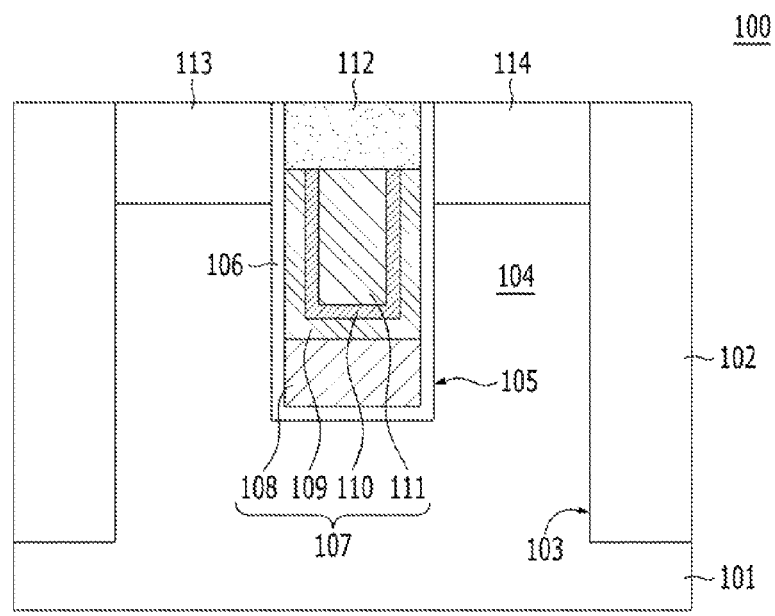
FIG. 2A is a cross-sectional view taken along the line A-A' of FIG. 1.
Figure 2B:
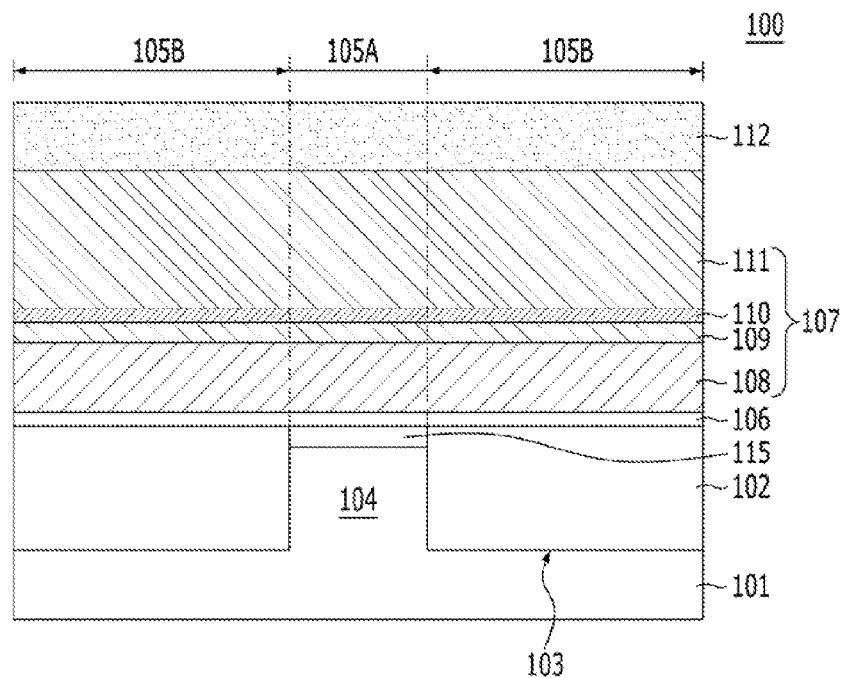
FIG. 2B is a cross-sectional view taken along the line B-B' of FIG. 1.

FIG. 1 is a plan view illustrating a transistor in accordance with a first embodiment of the present invention. FIG. 2A is a cross-sectional view taken along the line A-A' of FIG. 1. FIG. 2B is a cross-sectional view taken along the line B-B' of FIG. 1.

A transistor 100 will be described with reference to FIGS. 1, 2A and 2B.

A substrate 101 is prepared. The substrate 101 may include a semiconductor substrate. The substrate 101 may be a silicon substrate. An isolation layer 102 is formed in the substrate 101. The isolation layer 102 may include an isolation dielectric layer which is gapfilled in an isolation trench 103. An active region 104 is defined in the substrate 101 by the isolation layer 102.

A trench 105 which has a predetermined depth is defined in the substrate 101. The trench 105 may be a line type which extends in any one direction. The trench 105 has a shape which extends across the active region 104 and the isolation layer 102. The trench 105 has a depth that is shallower than the isolation trench 103. The trench 105 includes a first trench 105A and a second trench 105B. The first trench 105A is defined in the active region 104. The second trench 105B is defined in the isolation layer 102. The first trench 105A and the second trench 105B may communicate with each other. The bottom surface of the first trench 105A and the bottom surface of the second trench 105B may be positioned at the same level.

A first impurity region 113 and a second impurity region 114 are formed in the substrate 101. Each of the first impurity region 113 and the second impurity region 114 is doped with a conductivity type impurity. For example, the conductivity type impurity may include phosphorus (P) or boron (B). The first impurity region 113 and the second impurity region 114 are formed in the active region 104 on both sides of the trench 105. The first impurity region 113 and the second impurity region 114 respectively correspond to a source region and a drain region. The bottom surfaces of the first impurity region 113 and the second impurity region 114 may be positioned at a predetermined depth from the top surface of the active region 104. The first impurity region 113 and the second impurity region 114 may define the sidewalls of the trench 105. The bottom surfaces of the first impurity region 113 and the second impurity region 114 may be higher than the bottom surface of the trench 105.

A gate dielectric layer 106 is formed on the bottom surface and the sidewalls of the trench 105. The gate dielectric layer 106 may include at least one selected from a silicon oxide, a silicon nitride, a silicon oxynitride and a high-k material. The high-k material may be a material which has a dielectric constant higher than the dielectric constants of a silicon oxide and a silicon nitride.

A buried gate electrode 107 is formed in the trench 105. The buried gate electrode 107 includes a first electrode 108, a liner electrode 109, a barrier layer 110, and a second electrode 111. The first electrode 108 is partially gapfilled in the trench 105. The liner electrode 109 is formed on the top surface of the first electrode 108 and the sidewalls of the trench 105. The second electrode 111 partially gapfills the trench 105 on the liner electrode 109. The height of the top surface of the liner electrode 109 and the second electrode 111 may be the same. A capping layer 112 is gapfilled on the liner electrode 109 and the second electrode 111. The barrier layer 110 is formed between the liner electrode 109 and the second electrode 111. The buried gate electrode 107 is positioned at a level lower than the top surface of the substrate 101.

The first electrode 108 includes a material which has specific resistance lower than the liner electrode 109. The first electrode 108 and the liner electrode 109 include materials which have different work functions. The first electrode 108 includes a high work function material. The liner electrode 109 includes a low work function material. The high work function material has a work function higher than the mid-gap work function of silicon. The low work function material has a work function lower than the mid-gap work function of silicon. The high work function material has a work function higher than approximately 4.5 eV. The low work function material has a work function lower than approximately 4.5 eV. The first electrode 108 includes a high work function metal-containing material. The high work function metal-containing material may include a petal nitride. The first electrode 108 may include a titanium nitride.

The liner electrode 109 includes an interface part and a side part. The interface part is positioned between the first electrode 108 and the second electrode 111, and the side part is positioned on the sidewalls of the second electrode 111. The side part overlaps with the first impurity region 113 and the second impurity region 114. The liner electrode 109 may have a U-shape. The liner electrode 109 may include a silicon-containing material. The silicon-containing material includes a polysilicon. The polysilicon may be doped with an impurity to have a low work function. For example, the liner electrode 109 may include a polysilicon which is doped with an N-type impurity. The liner electrode 109 may include an N-type doped polysilicon which is doped with phosphorus or arsenic. The first electrode 108 does not overlap with the first impurity region 113 and the second impurity region 114. The side part of the liner layer 109 overlaps with the first impurity region 113 and the second impurity region 114. Since the liner electrode 109 has a low work function, it may be possible to prevent gate-induced drain leakage (GIDL) from occurring in the first impurity region 113 and the second impurity region 114 by the liner electrode 109. A threshold voltage is controlled by the high work function of the first electrode 108. For example, the impurity concentration of a channel may be decreased by the high work function of the first electrode 108. The channel is introduced with an impurity for threshold voltage adjustment.

The second electrode 111 includes a low resistance material. The second electrode 111 includes a material which decreases the resistance of the buried gate electrode 107. The second electrode 111 includes a material which has a specific resistance lower than the first electrode 108 and the liner electrode 109. The second electrode 111 may include a metal-containing material. The second electrode 111 may include tungsten as a low resistance layer. Therefore, the first electrode 108 and the second electrode 111 may include a metal-containing material, and the liner electrode 109 may include a non-metal material. To decrease the resistance of the buried gate electrode 107, the liner electrode 109 is formed to a thin thickness.

The barrier layer 110 plays the role of preventing the reaction of the liner electrode 109 and the second electrode 111. The barrier layer 110 may include a metal-containing material which has a specific resistance lower than the liner electrode 109. The barrier layer 110 may include a titanium-containing material. For example, the barrier layer 110 may include a titanium nitride. The barrier layer 110 may suppress the reaction of the liner electrode 109 and the second electrode 111, and accordingly, leakage current may be reduced. Additionally, the barrier layer 110 prevents the liner electrode 109 and the second electrode 111 from directly contacting each other, thus, contact resistance is decreased.

The capping layer 112 protects the buried gate electrode 107. The capping layer 112 may include a dielectric material. The capping layer 112 may include a silicon nitride.

The buried gate electrode 107, the first impurity region 113 and the second impurity region 114 may constitute the transistor 100. The channel of the transistor 100 may be defined along the trench 105 between the first impurity region 113 and the second impurity region 114. The buried gate electrode 107 becomes a dual work function buried gate (BG) electrode. The dual work function buried gate electrode includes the first electrode 108 having a high work function and the liner electrode 109 having a low work function.

Figure 3A:
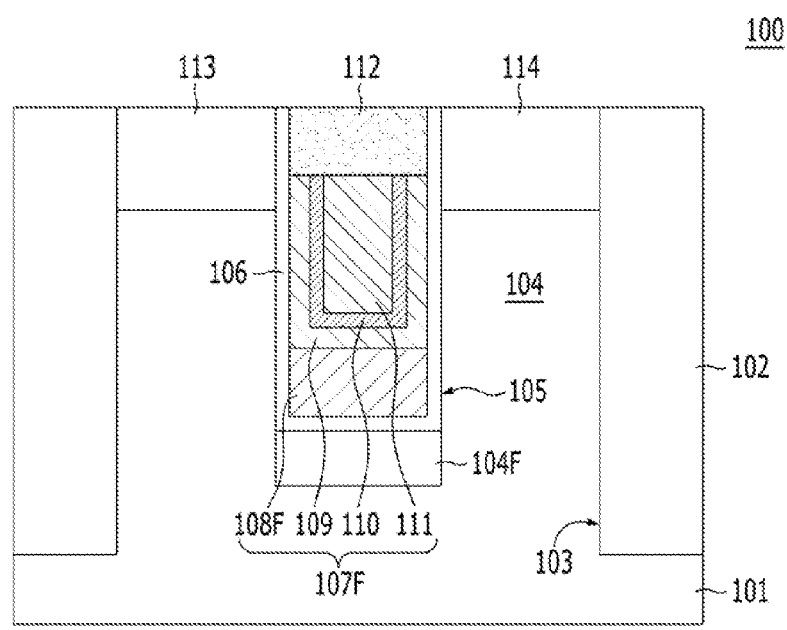
FIGS. 3A and 3B are cross-sectional views illustrating a transistor in accordance with a second embodiment of the present invention.
Figure 3B:
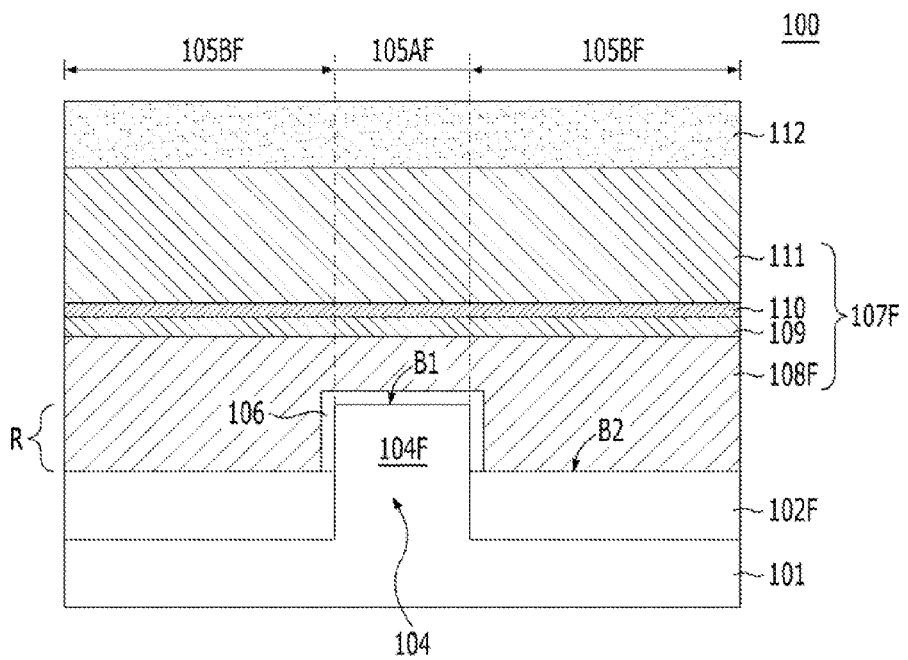

FIGS. 3A and 3B are cross-sectional views illustrating a transistor in accordance with a second embodiment of the present invention. FIG. 3A is a cross-sectional view taken along the line A-A' of FIG. 1. FIG. 3B is a cross-sectional view taken along the line B-B' of FIG. 1. Some components of a transistor 100 in accordance with the second embodiment of the present invention may be the same as those of the transistor 100 in accordance with the first embodiment of the present invention. Detailed descriptions for the same components will be omitted.

Referring to FIGS. 3A and 3B, a trench 105 includes a first trench 105AF and a second trench 105BF. The first trench 105AF is defined in an active region 104. The second trench 105BF is defined in an isolation layer 102. The first trench 105AF and the second trench 105BF may communicate with each other. The first trench 105AF and the second trench 105BF may have bottom surfaces which are positioned at different levels. For example, a bottom surface B1 of the first trench 105AF may be positioned at a higher level than a bottom surface B2 of the second trench 105BF. The height difference between the first trench 105AF and the second trench 105BF is induced as the isolation layer 102 is recessed on the bottom of the trench 105. The second trench 105BF includes a recess region R which has the bottom surface B2 positioned lower than the bottom surface B1 of the first trench 105AF.

Due to the step portion formed between the first trench 105AF and the second trench 105BF, a fin region 104F is formed in the active region 104. In this way, the fin region 104F is formed on the bottom of the trench 105, and the sidewalls of the fin region 104F are exposed by the recess region R. The fin region 104F serves as a location where a channel is to be formed. The fin region 104F is referred to as a saddle fin. By forming the fin region 104F, channel width may be increased and electrical characteristics may be improved. A gate dielectric layer 106 is formed on the sidewalls and the top surface of the fin region 104F. A first electrode 108F has a shape which covers the sidewalls and the top surface of the fin region 104F. The first electrode 108E is formed in the trench 105 while filling the recess region R. The cross-sectional area of the first electrode 108E is wider in the isolation layer 102 than in the active region 104. A liner layer 109 is not positioned close to the sidewalls of the fin region 104F. The fin region 104F is influenced by the high work function of the first electrode 108F.

The transistor 100 in accordance with the second embodiment of the present invention is referred to as a buried gate type fin channel transistor.

According to the first embodiment and the second embodiment, the low resistance of the buried gate electrodes 107 shown in FIG. 2B, and 107F is secured by the second electrode 111. Channel dose may be decreased by the first electrodes 108 and 108F. Gate-induced drain leakage (GIDL) may be reduced by the liner electrode 109. An abnormal reaction between the liner electrode 109 and the second electrode 111 may be prevented by the barrier layer 110.

A method for fabricating the transistor in accordance with the first embodiment of the present invention will now be described. FIGS. 4A to 4F are views illustrating an exemplary method for fabricating the transistor in accordance with the first embodiment of the present invention. FIGS. 4A to 4F are cross-sectional views take along the line A-A' of FIG. 1.

Figure 4A:
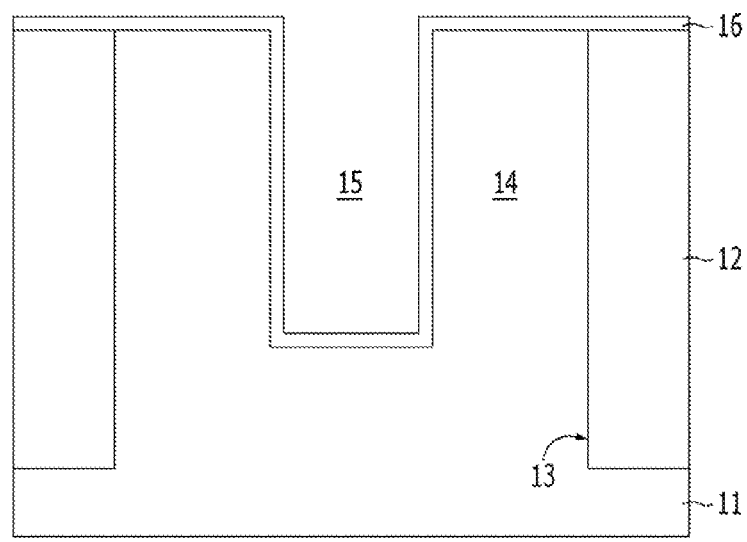
FIGS. 4A to 4F are views illustrating an exemplary method for fabricating a transistor in accordance with the first embodiment of the present invention.

As shown in FIG. 4A, an isolation layer 12 is formed in a substrate 11. An active region 14 is defined by the isolation layer 12. The isolation layer 12 may be formed through an STI (shallow trench isolation) process. For example, after forming a pad layer (not shown) on the substrate 11, the pad layer and the substrate 11 are etched using an isolation mask (not shown) to define an isolation trench 13. By gapfilling a dielectric material in the isolation trench 13, the isolation layer 12 is formed. A wall oxide, a liner and a gapfill dielectric may be sequentially formed as the isolation layer 12. The liner may be formed by stacking a silicon nitride and a silicon oxide. The silicon nitride may include $Si_3N_4$, and the silicon oxide may include $SiO_2$. The gapfill dielectric may include a spin-on dielectric (SOD) In another embodiment of the present invention, the isolation layer 12 may use a silicon nitride as the gapfill dielectric.

A trench 15 is defined in the substrate 11. The trench 15 may be defined as a line type which extends across the active region 14 and the isolation layer 12. The trench 15 may be defined by forming a mask pattern (not shown) on the substrate 11 and performing an etching process using the mask pattern as an etch mask. The trench 15 may be defined to be shallower than the isolation trench 13.

A gate dielectric layer 16 is formed on the surface of the trench 15. The gate dielectric layer 16 may be formed through a thermal oxidation process. In another embodiment of the present invention, the gate dielectric layer 16 may be formed by chemical vapor deposition (CVD) or atomic layer deposition (ALD). The gate dielectric layer 16 may include at least one selected among a high-material, an oxide, a nitride and an oxynitride. The high-k material may be a material which has a dielectric constant higher than the dielectric constants of a silicon oxide and a silicon nitride.

For example, the high-k material may be at least one selected among metal oxides such as a hafnium oxide and an aluminum oxide.

Figure 4B:
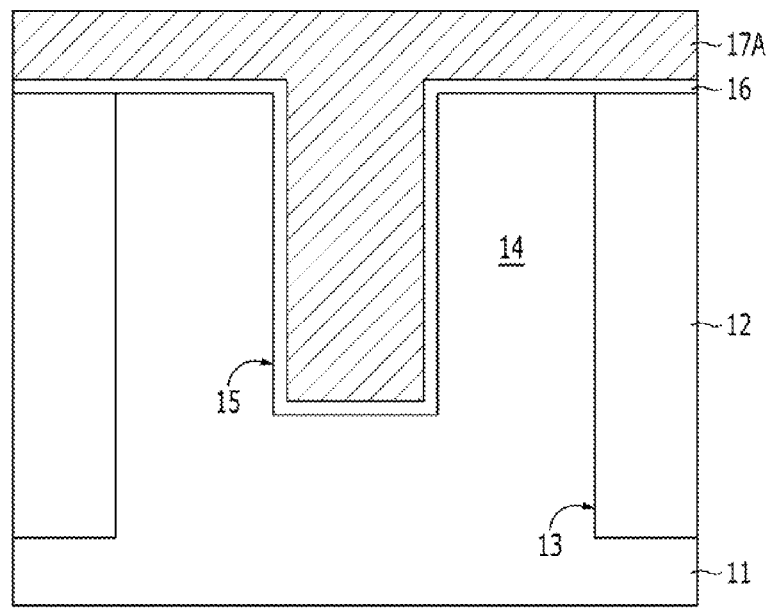

As shown in FIG. 4B, a first conductive layer 17A is formed on the gate dielectric layer 16. The first conductive layer 17A gapfills the trench 15. The first conductive layer 17A includes a high work function material. The first conductive layer 17A may include a titanium nitride.

Figure 4C:
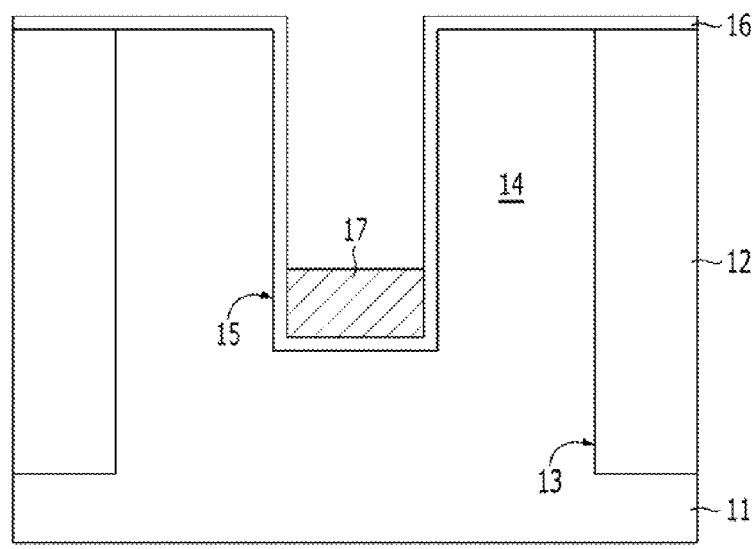

As shown in FIG. 4C, a first electrode 17 which partially fills the trench 15 is formed. The first electrode 17 is formed through etching of the first conductive layer 17A. The first conductive layer 17A may be etched by an etch-back process.

Figure 4D:
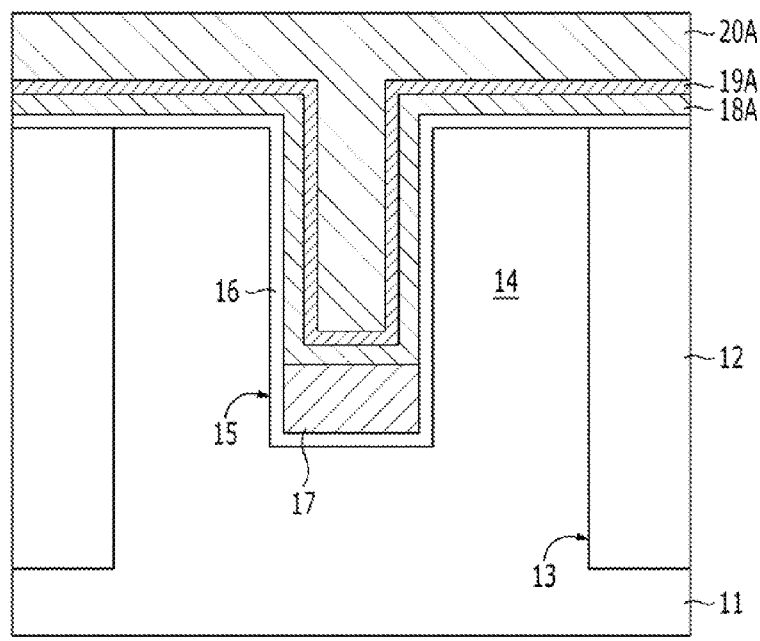

As shown in FIG. 4D, a second conductive layer 18A is formed. The second conductive layer 18A is conformally formed on the first electrode 17. The second conductive layer 18A includes a material which has a different work function from the first electrode 17. The second conductive layer 18A includes a low work function material. The second conductive layer 18A may include a polysilicon layer. The second conductive layer 18A may include an N-type doped polysilicon.

A third conductive layer 19A and a fourth conductive layer 20A are formed on the second conductive layer 18A. The third conductive layer 19A is conformally formed, and the fourth conductive layer 20A gapfills the trench 15. The third conductive layer 19A may include a titanium nitride. The fourth conductive layer 20A may include tungsten as a low resistance layer.

Figure 4E:
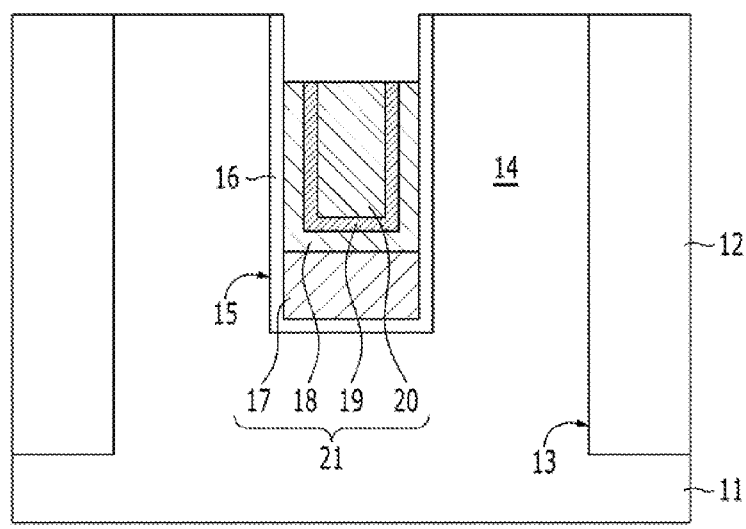

As shown in FIG. 4E, a removal process is performed so that the second conductive layer 18A, the third conductive layer 19A and the fourth conductive layer 20A remain in the trench 15. The removal process may include an etch-back process and forms a liner electrode 18, a barrier layer 19 and a second electrode 20. The liner electrode 18 is formed by the etch-back process of the second conductive layer 18A, and the barrier layer 19 and the second electrode 20 are respectively formed by the etch-back processes of the third conductive layer 19A and the fourth conductive layer 20A. A planarization process may be performed before an etch-back process so that a buried gate electrode 21 is formed in the trench 15. The buried gate electrode 21 includes the first electrode 17, the liner electrode 18, the barrier layer 19 and the second electrode 20.

Figure 4F:
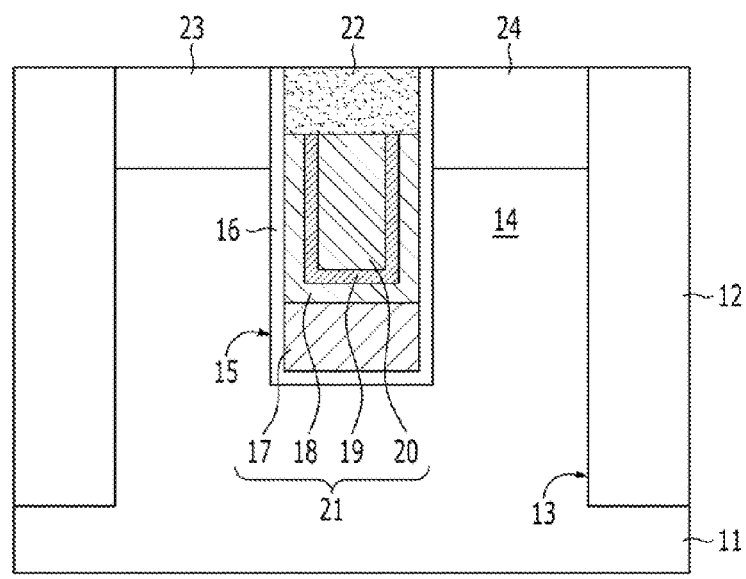

As shown in FIG. 4F, a capping layer 22 is formed on the buried gate electrode 21. The capping layer 22 may include a silicon nitride. A silicon nitride is formed on the buried gate electrode 21 to gapfill the trench 15. Subsequently, a planarization process is performed such that the silicon nitride remains in the trench 15.

A doping process of an impurity is performed by implantation or another doping technology so that a first impurity region 23 and a second impurity region 24 are formed in the substrate 11.

A method for fabricating the transistor in accordance with the second embodiment of the present invention will now be described. FIGS. 5A to 5F are views illustrating an exemplary method for fabricating the transistor in accordance with the second embodiment of the present invention. FIGS. 5A to 5F are cross-sectional views taken along the line B-B' of FIG. 1.

Figure 5A:
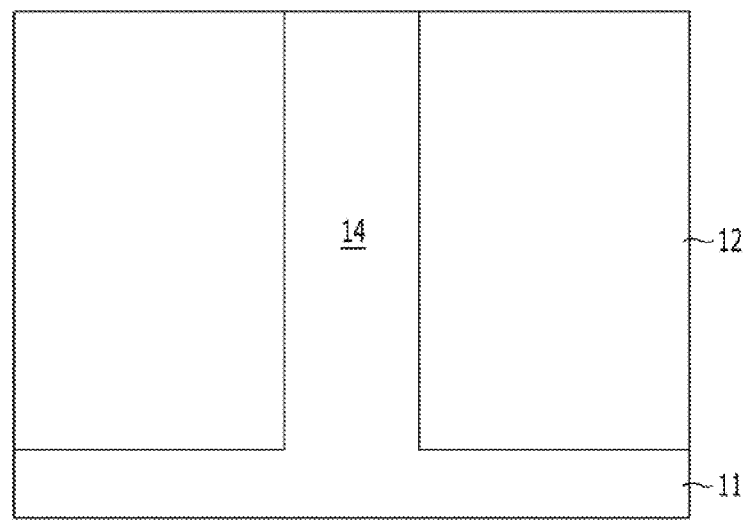
FIGS. 5A to 5F are views illustrating an exemplary method for fabricating a transistor in accordance with the second embodiment of the present invention.

As shown in FIG. 5A, an isolation layer 12 is formed in a substrate 11. An active region 14 is defined in the isolation layer 12. The isolation layer 12 may be formed by an STI process.

Figure 5B:
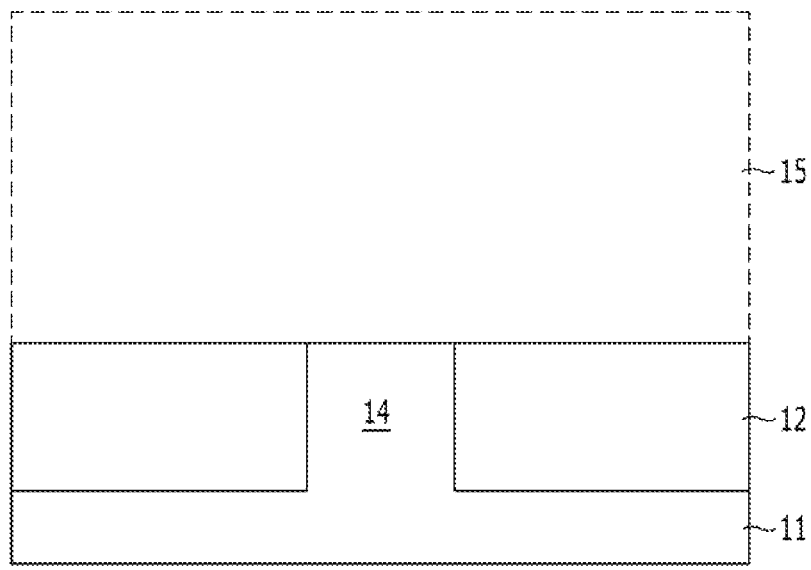

As shown in FIG. 5B, a trench 15 is defined in the substrate 11. The trench 15 may be defined as a line type which extends across the active region 14 and the isolation layer 12. The trench 15 may be defined by forming a mask pattern (not shown) on the substrate 11 and performing an etching process using the mask pattern as an etch mask.

Figure 5C:
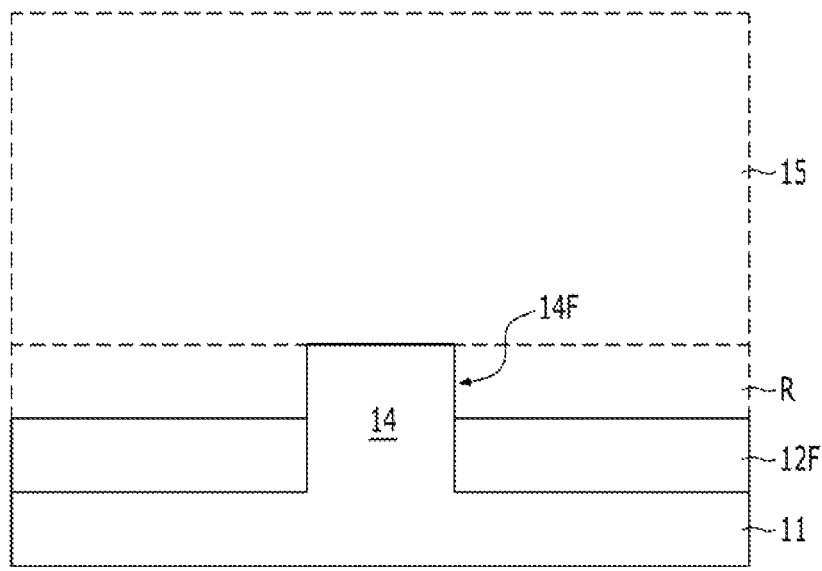

As shown in FIG. 5C, the isolation layer 15 is recessed to a predetermined depth defining a recess region R, and a fin region 14F is formed by the recess region R.

Figure 5D:
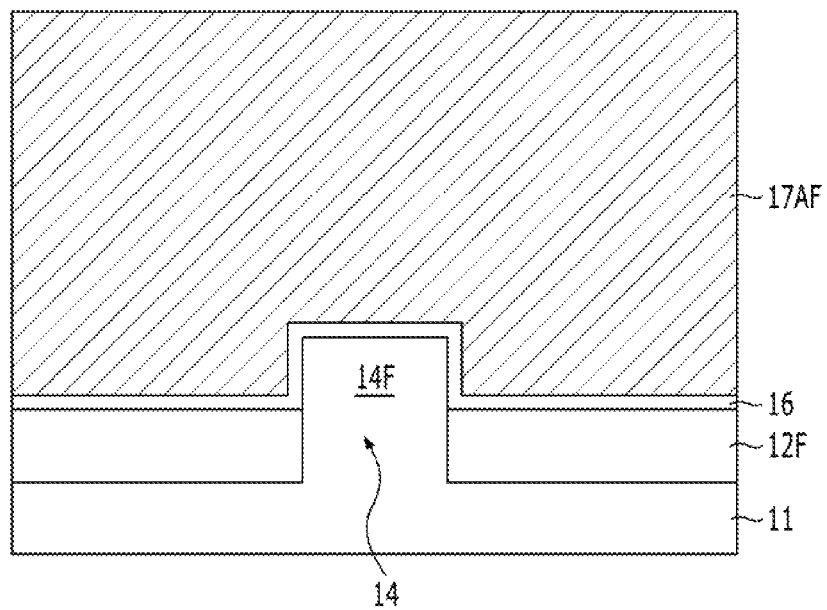

As shown in FIG. 5D, a gate dielectric layer 16 is formed on the bottom surfaces of the fin region 14F and the trench 15 shown in FIG. 5C. The gate dielectric layer 16 may be formed through a thermal oxidation process. In another embodiment of the present invention, the gate dielectric layer 16 may be formed by chemical vapor deposition (CVD) or atomic layer deposition (ALD). The gate dielectric layer 16 may include at least one selected among a high-k material, an oxide, a nitride and an oxynitride. The high-k material may be a material which has a dielectric constant higher than the dielectric constants of a silicon oxide and a silicon nitride. For example, the high-k material may be at least one selected among metal oxides such as a hafnium oxide and an aluminum oxide.

A first conductive layer 17AF is formed on the gate dielectric layer 16. The first conductive layer 17AF gapfills the trench 15 and the recess region R both shown in FIG. 5C. The first conductive layer 17AF includes a high work function material. The first conductive layer 17AF may include a titanium nitride.

Figure 5E:
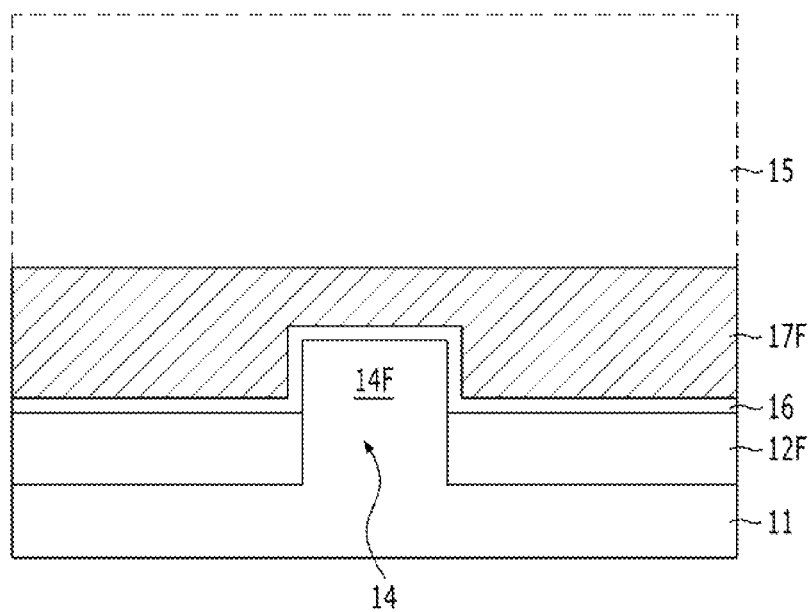

As shown in FIG. 5E, a first electrode 17F is formed to partially fill the trench 15. The first electrode 17F fully gapfills the recess region R shown in FIG. 5C and covers the fin region 14F. The first electrode 17F is formed by etching of the first conductive layer 17AF shown in FIG. 5D. The first conductive layer 17AF may be etched by an etch-back process.

Figure 5F:
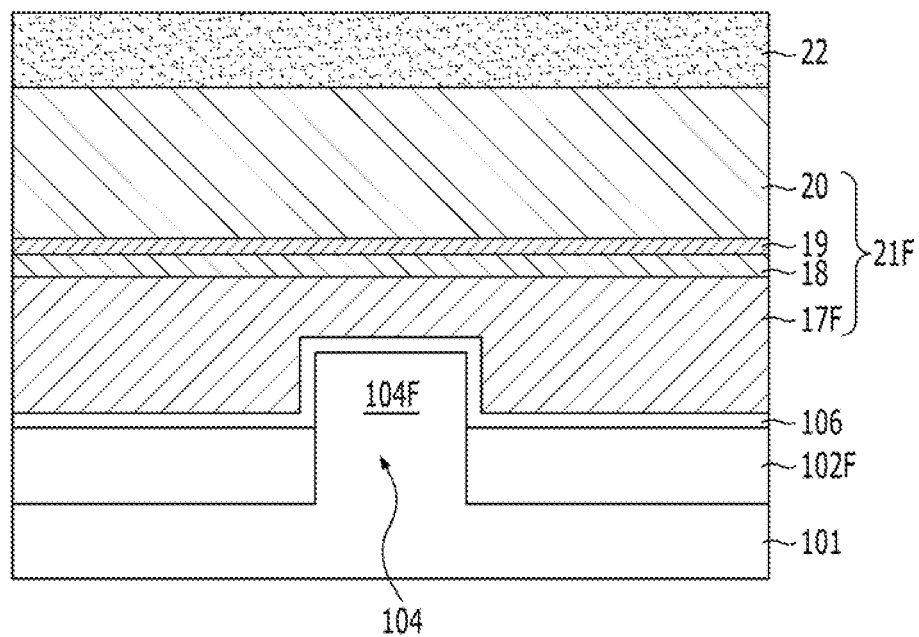

As shown in FIG. 5F, a liner electrode 18, a barrier layer 19 and a second electrode 20 are formed on the first electrode 17F.

A capping layer 22 is formed on the second electrode 20.

Figure 6:
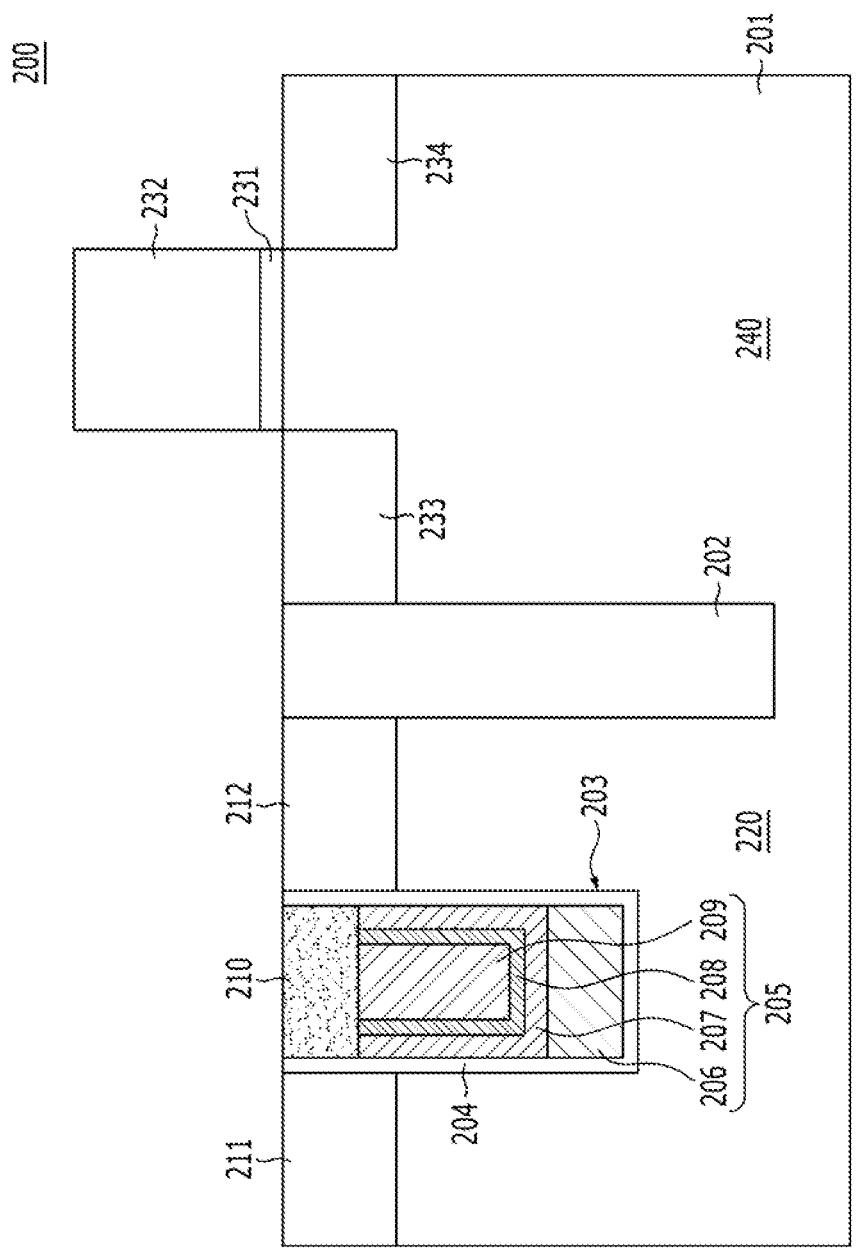
FIG. 6 is a view illustrating an exemplary semiconductor device including a transistor in accordance with the embodiments of the present invention.

FIG. 6 is a view illustrating a semiconductor device including a transistor in accordance with the embodiments of the present invention.

Referring to FIG. 6, a semiconductor device 200 includes a first transistor 220 and a second transistor 240. The first transistor 220 and the second transistor 240 are formed in a substrate 201, and are isolated from each other by an isolation layer 202.

The first transistor 220 includes a buried gate electrode 205, a first source region 211, and a first drain region 212. The buried gate electrode 205 is formed in a trench 203. A first gate dielectric layer 204 is formed on the surface of the trench 203. The buried gate electrode 205 includes a first electrode 206, a liner electrode 207, a barrier layer 208, and a second electrode 209. A capping layer 210 is formed on the second electrode 209. A fin region (not shown) may be additionally formed under the buried gate electrode 205. The buried gate electrode 205 may have a configuration according to the first embodiment and the second embodiment of the present invention. That is, the buried gate electrode 205 has the structure of a dual work function buried gate electrode.

The second transistor 240 includes a planar gate electrode 232, a second source region 233, and a second drain region 234. A second gate dielectric layer 231 is formed under the planar gate electrode 232. The planar gate electrode 232 may include a polysilicon, a metal, a metal nitride, a metal compound, or a combination thereof. The second gate dielectric layer 231 may include at least one selected from a silicon oxide, a silicon nitride, a silicon oxynitride and a high-k material. The high-k material may have a dielectric constant higher than the dielectric constants of a silicon oxide and a silicon nitride. An interface layer and a high-k material may be stacked to form the second gate dielectric layer 23. The interface layer may include a silicon oxide, a silicon nitride or a silicon oxynitride.

In the semiconductor device 200, the first transistor 220 having the buried gate electrode 205 and the second transistor 240 having the planar gate electrode 232 are integrated in one substrate 201. After forming the first transistor 220, the second transistor 240 may be formed.

In the semiconductor device 200, both the first transistor 220 and the second transistor 240 may be NMOSFETs.

The semiconductor device 200 may be a CMOSFET. For example, the first transistor 220 may become an NMOSFET, and the second transistor 240 may become a PMOSFET. In the case of the PMOSFET, a P-type work function material may be selected as the planar gate electrode 232 to have a work function appropriate for a PMOSFET.

The first transistor 220 is referred to as a buried gate type transistor, and the second transistor 240 is referred to as a planar gate type transistor. The planar gate type transistor is an example of a non-buried gate type transistor. The non-buried gate type transistor may further include a fin type transistor which is generally known in the art. The fin type transistor is different from a buried gate type fin channel transistor. In the fin type transistor, a fin region is formed by recessing an isolation layer so that an active region protrudes, without defining a trench.

In the semiconductor device 200, the first transistor 220 may be the transistor of a memory cell, and the second transistor 240 may be the transistor of a peripheral circuit region.

Due to the fact that the buried gate electrode 205 includes the first electrode 206 formed of a high work function material and the liner electrode 207 formed of a low work function material, and the liner electrode 207 is formed to overlap with the first source region 211 and the first drain region 212, not only may gate resistance be decreased, but also gate-induced drain leakage (GIDL) may be reduced, improving the performance of the semiconductor device 200.

Figure 7:
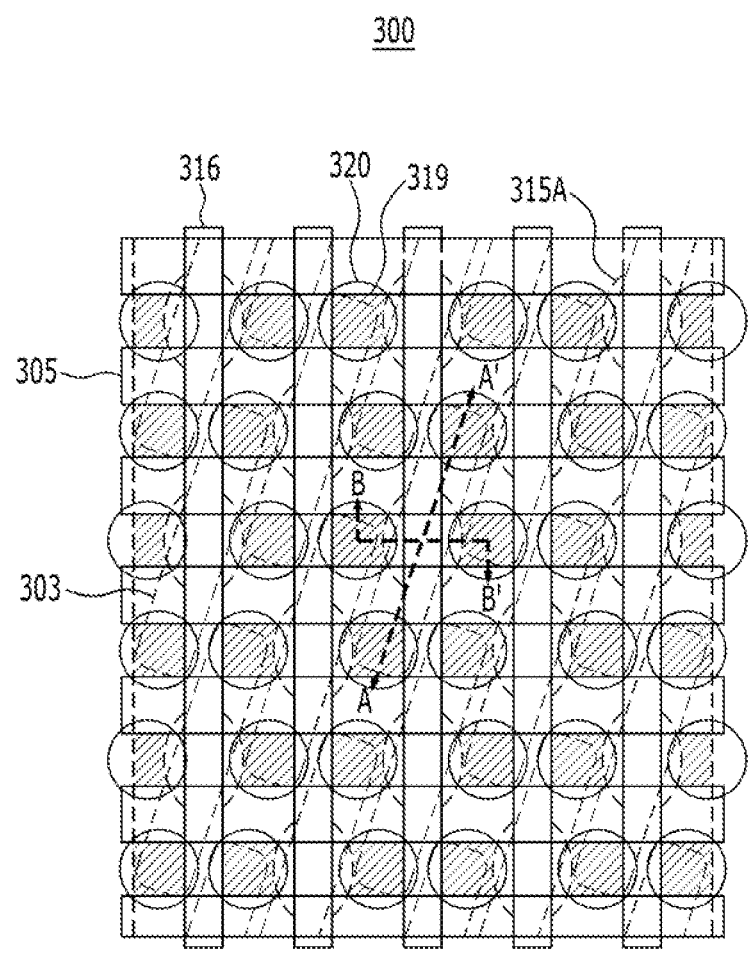
FIG. 7 is a plan view illustrating another exemplary semiconductor device including a transistor in accordance with the embodiments of the present invention.
Figure 8A:
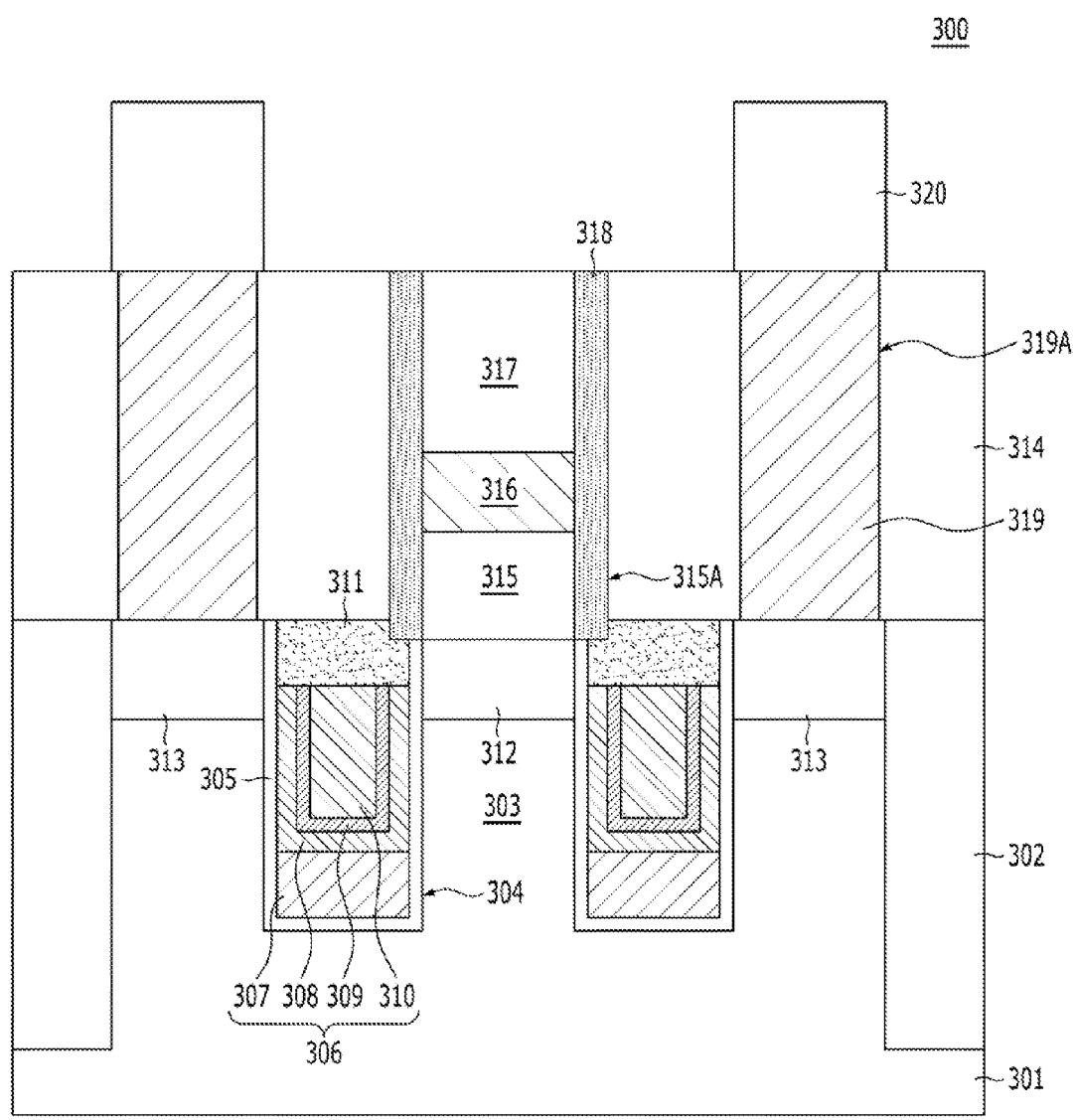
FIG. 8A is a cross-sectional view taken along the line A-A' of FIG. 7.
Figure 8B:
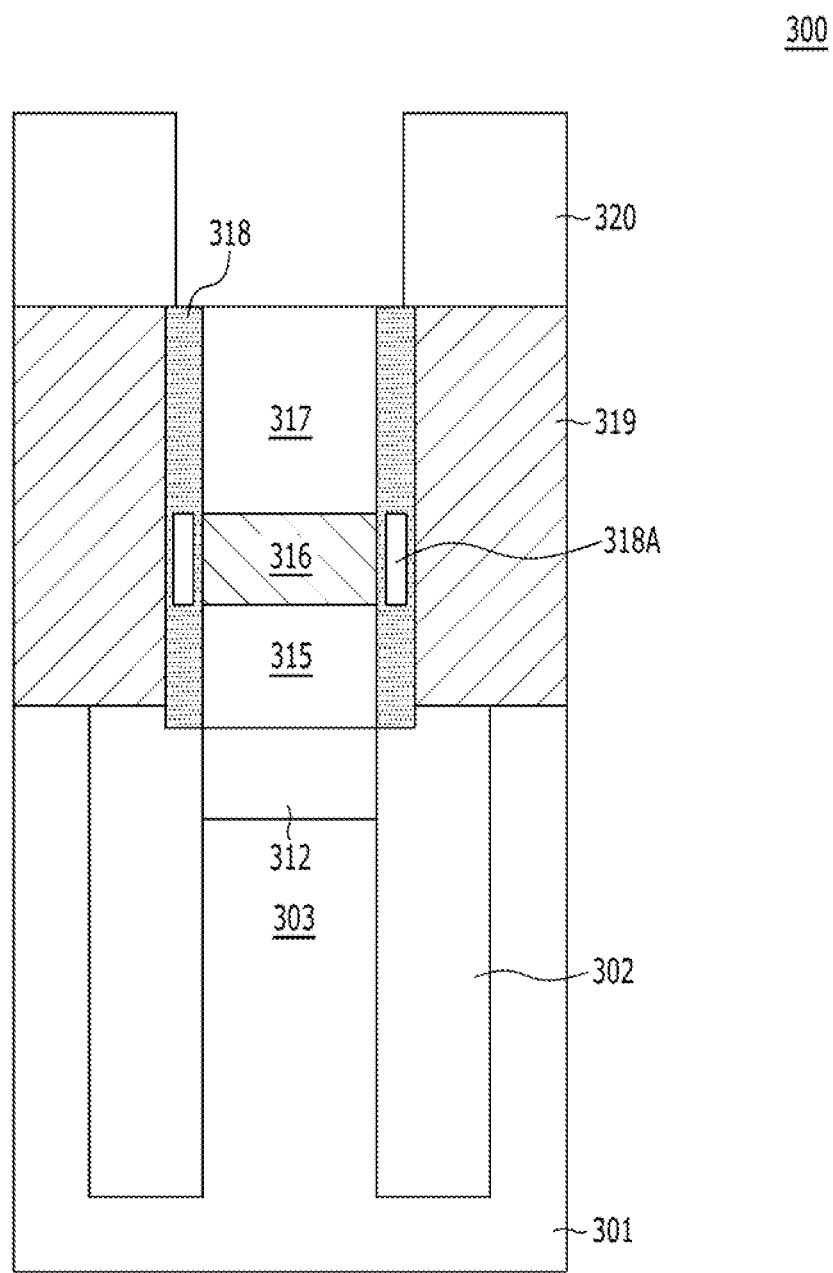
FIG. 8B is a cross-sectional view taken along the line B-B' of FIG. 7.

FIG. 7 is a plan view illustrating another exemplary semiconductor device including the buried gate type transistor in accordance with the embodiments of the present invention. FIG. 7 is a plan view illustrating a memory cell array, FIG. 8A is a cross-sectional view taken along the line A-A' of FIG. 7. FIG. 8B is a cross-sectional view taken along the line B-B' of FIG. 7.

Referring to FIGS. 7, 8A and 8B, a memory cell array 300 includes a plurality of buried gate electrodes 306, a plurality of bit lines 316 which extend in a direction crossing with the buried gate electrodes 306, and a plurality of memory elements 320.

The memory cell array 300 will be described below in detail.

An isolation layer 302 is formed in a substrate 301. A plurality of active regions 303 are defined by the isolation layer 302. Gate trenches 304 are defined to extend across the active regions 303. A gate dielectric layer 305 is formed on the surfaces of the gate trenches 304. The buried gate electrodes 306 are formed on the gate dielectric layer 305 to partially fill the gate trenches 304. Each of the buried gate electrodes 306 includes a first electrode 307, a liner electrode 308, a barrier layer 309, and a second electrode 310. A capping layer 311 is formed on the second electrode 310.

A fin region (not shown) may be additionally formed under the buried gate electrode 306. The buried gate electrode 306 may have a configuration according to the first embodiment and the second embodiment of the present invention. That is, the buried gate electrode 306 has the structure of a dual work function buried gate electrode. A first impurity region 312 and a second impurity region 313 are formed in the substrate 301 on both sides of the buried gate electrode 306. A bit line structure which is electrically connected with the first impurity region 312 may be formed. The bit line structure includes the bit line 316 and a bit line hard mask layer 317. The bit line structure may further include a first contact plug 315 which is interposed between the bit line 316 and the first impurity region 312. Spacers 318 are formed on the sidewalls of the bit line structure. An isolation layer 314 is formed on the substrate 301. The first contact plug 315 may be formed in a first contact hole 315A. The first contact plug 315 is electrically connected with the first impurity region 312. The diameter of the first contact hole 315A may be higher than the line width of the bit line 316. The line widths of the first contact plug 315 and the bit line 316 may be the same as each other. Therefore, gaps are defined between the first contact plug 315 and the sidewalls of the first contact hole 315A, and portions of the spacers 318 extend to be filled in the gaps. The surface of the first impurity region 312 may be recessed to increase the contact area between the first contact plug 315 and the first impurity region 312. The bit line 316 may be a line type which extends in a direction crossing the buried gate electrodes 306. The bit line 316 may include at least one selected among a polysilicon, a metal silicide, a metal nitride and a metal. The bit line hard mask layer 317 may include a silicon oxide or a silicon nitride. The first contact plug 315 may include at least one selected among a polysilicon, a metal silicide, a metal nitride and a metal. The spacers 318 include a dielectric material. The spacers 318 may include a silicon oxide, a silicon nitride or a combination of a silicon oxide and a silicon nitride. The spacers 318 may have a multi-spacer structure. For example, the spacers 318 may have an NON structure of a silicon nitride/a silicon oxide/a silicon nitride. The spacers 318 may also have an air-gap embedded multi-spacer structure. Air gaps 318A may be defined between the bit line 316 and second contact plugs 319. The spacers 318 may have an N-Air-N structure in which air gaps 318A are positioned between silicon nitrides. The air gaps 318A may be positioned between the bit line 316 and the second contact plugs 319. Furthermore, the air gaps 318A may extend to be positioned between the first contact plug 315 and the second contact plugs 319. The parasitic capacitance between the bit line 316 and the second contact plugs 319 is decreased by the presence of the air gaps 318A. Since the parasitic capacitance is decreased, sensing margin may be improved.

The memory element 320 may be formed on the second impurity region 313. The second contact plug 319 may be formed between the memory element 320 and the second impurity region 313. A second contact hole 319A is defined to pass through the isolation layer 314, and each second contact plug 319 may be formed in the second contact hole 319A. The second contact plug 319 is electrically connected with the second impurity region 313. The second contact plug 319 may include at least one selected among a polysilicon, a metal, a metal silicide and a metal nitride. For example, the second contact plug 319 may include a plug structure in which a polysilicon, a metal silicide and a metal are stacked. The isolation layer 314 may be a single layer or multiple layers. The isolation layer 314 may include at least one selected among a silicon oxide, a silicon nitride and a silicon oxynitride. The isolation layer 314 may be formed through a damascene process or the like. The isolation layer 314 serves to isolate adjacent second contact plugs 319 from each other. In another embodiment of the present invention, contact spacers which surround the sidewalls of the second contact plugs 319 may be additionally formed. The contact spacers may have an air-gap embedded multi-spacer structure, or the spacers 318 may not be defined with the air gaps 318A. The top surfaces of the isolation layer 314 and the bit line structure may be positioned at the same level. In another embodiment of the present invention, third contact plugs (not shown) may be additionally formed on the second contact plugs 319. Each of the third contact plugs may have a shape which overlaps with the bit line structure and the second contact plug 319. The third contact plugs may include a metal material.

The memory element 320 which is electrically connected with the second contact plug 319 may be formed on the second contact plug 319. The memory element 320 may be embodied in various forms.

The memory element 320 may be a capacitor. Accordingly, the memory element 320 may include a storage node which contacts the second contact plug 319. The storage node may have a cylinder shape or a pillar shape. A capacitor dielectric layer may be formed on the surface of the storage node. The capacitor dielectric layer may include at least one selected among a zirconium oxide, an aluminum oxide and a hafnium oxide. For example, the capacitor dielectric layer may have a ZAZ structure in which a first zirconium oxide, an aluminum oxide and a second zirconium oxide are stacked. A plate node may be formed on the capacitor dielectric layer. Each of the storage node and the plate node may include a metal-containing material.

The memory element 320 may include a variable resistor. The variable resistor may include a phase change material. The phase change material may include at least one selected between Te and Se as chalcogenide elements. In another embodiment of the present invention, the variable resistor may include a transition metal oxide. In still another embodiment, the variable resistor may be a magnetic tunnel junction (MTJ).

Due to the fact that the buried gate electrode 306 includes the first electrode 307 formed of a high work function material and the liner electrode 308 formed of a low work function material, and the liner electrode 308 is formed to overlap with the first impurity region 312 and the second impurity region 313, not only may gate resistance be decreased, but also gate-induced drain leakage (GIDL) may be reduced.

Accordingly, the data retention time of a memory cell may be increased and the refresh characteristics of a semiconductor device may be improved.

The transistors according to the embodiments of the present invention may be integrated in transistor circuits. Additionally, the transistors according to the embodiments of the present invention may be applied to integrated circuits having transistors for various purposes. For example, the transistors according to the embodiments of the present invention may be applied to integrated circuits including an IGFET (insulated gate FET), an HEMT (high electron mobility transistor), a power transistor, a TFT (thin film transistor), and so forth.

The transistors and the integrated circuits according to the embodiments of the present invention may be built into an electronic device. The electronic device may include a memory portion and a non-memory portion. The memory portion may include an SRAM, a DRAM, a FLASH, an MRAM, a ReRAM, an STTRAM, a FeRAM, and the like. The non-memory portion may include a logic circuit. For controlling a memory device, the logic circuit may include a sense amplifier, a decoder, an input/output circuit and so forth. Additionally, the logic circuit may include various integrated circuits (ICs) other than a memory. For example, the logic circuit may include a microprocessor, an application processor of a mobile device, and so forth. Furthermore, the non-memory portion includes a logic gate such as a NAND gate, a driver IC for a display device, a power semiconductor device such as a power management IC (PMIC), and so forth. The electronic device may include a computing system, an image sensor, a camera, a mobile device, a display device, a sensor, a medical instrument, an optoelectronic device, a radio frequency identification (RFID), a photovoltaic cell, a semiconductor device for an automobile, a semiconductor device for a railroad car, a semiconductor device for an aircraft and so forth.

Various application examples including the transistor according to the embodiments of the present invention will now be described.

Figure 9A:
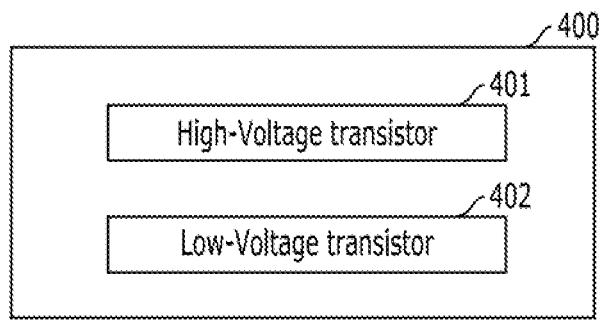
FIGS. 9A to 9C are diagrams illustrating various application examples of an integrated circuit including a transistor in accordance with the embodiments of the present invention.
Figure 9B:
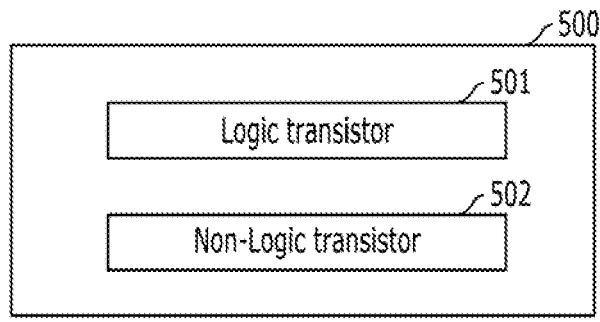
Figure 9C:
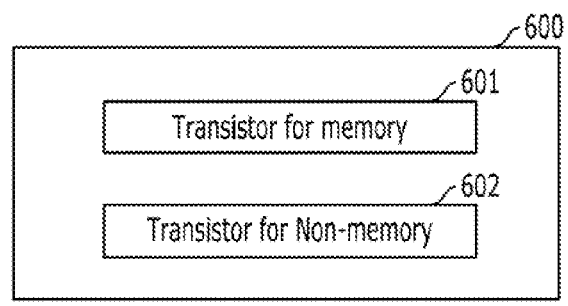

FIGS. 9A to 9C are diagrams illustrating various application examples of an integrated circuit including a transistor in accordance with the embodiments of the present invention.

An integrated circuit 400 shown in FIG. 9A includes a plurality of high voltage transistors 401 and a plurality of low voltage transistors 402.

An integrated circuit 500 shown in FIG. 9B includes a plurality of logic transistors 501 and a plurality of non-logic transistors 502.

An integrated circuit 600 shown in FIG. 9C includes transistors 601 for a memory device and transistors 602 for a non-memory device.

The above-described high voltage transistors 401, low voltage transistors 402, logic transistors 501, non-logic transistors 502, transistors 601 for a memory device, and transistors 602 for a non-memory device may include the buried gate type transistors according to the embodiments of the present invention. A buried gate type transistor included in the integrated circuits 400, 500 and 600, includes a buried gate electrode which is formed in a trench. The buried gate electrode includes a dual work function buried gate electrode. The buried gate electrode includes a first electrode of a high work function, a liner electrode of a low work function, a second electrode of low resistance, and a barrier layer between the liner electrode and the second electrode. The liner electrode overlaps with a source region and a drain region, and therefore, improves gate-induced drain leakage (GIDL) characteristics.

Therefore, the performance of the integrated circuits 400, 500 and 600 may be improved.

Figure 10:
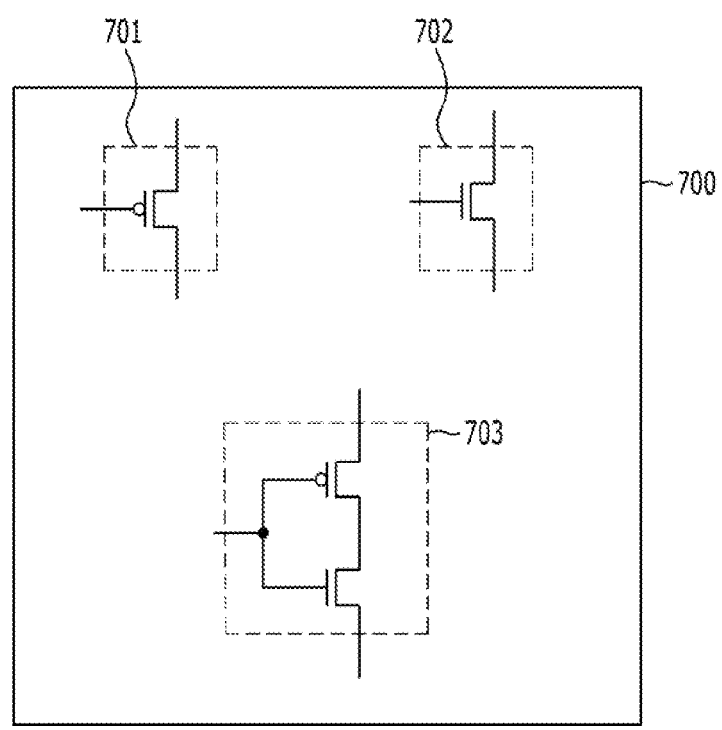
FIG. 10 is a diagram illustrating an electronic device including a transistor in accordance with the embodiments of the present invention.

FIG. 10 is a diagram illustrating an electronic device including a transistor in accordance with the embodiments of the present invention.

Referring to FIG. 10, an electronic device 700 includes a plurality of transistors. The electronic device 700 may include a plurality of PMOSFETs 701, a plurality of NMOS-FETs 702 and a plurality of CMOSFETs 703. At least one of the PMOSFETs 701, the NMOSFETs 702 and the CMOS-FETs 703 transistors, may include the buried gate type transistors according to the embodiments of the present invention. A buried gate type transistor included in the electronic device 700 includes a buried gate electrode which is formed in a trench. The buried gate electrode includes a dual work function buried gate electrode. The buried gate electrode includes a first electrode of a high work function, a liner electrode of a low work function a second electrode of low resistance, and a barrier layer between the liner electrode and the second electrode. The liner electrode overlaps with a source region and a drain region and, therefore, improves gate-induced drain leakage (GIRL) characteristics. Accordingly, the electronic device 700 may scaled-down and operate at high speed.

As is apparent from the above descriptions, according to the embodiments of the present invention, since a low work function material is formed between a metal gate electrode and source/drain regions, current drivability may be improved and gate-induced drain leakage (GIDL) may be reduced.

Additionally, according to the embodiments of the present invention, since a barrier layer is formed between the metal gate electrode and the low work function material, it may be possible to prevent a reaction of the metal gate electrode and the low work function material, thereby suppressing the work function change and contact resistance increase of the low work function material.

Furthermore, according to the embodiments of the present invention, the channel dose may be decreased by a high work function material.

According to the embodiments of the present invention, due to the fact that a buried gate electrode is formed using a high work function material and a low work function material in a manner such that the low work function material overlaps with the source/drain regions, not only may gate resistance be decreased, but also gate-induced drain leakage (GIDL) may be reduced.

Although various embodiments have been described for Illustrative purposes, it will be apparent to those skilled in the art that various changes and modifications may be made without departing from the spirit and scope of the disclosure as defined in the following claims.

What is claimed is:

1. A transistor comprising:
   a source region and a drain region separately formed in a substrate;
   a trench defined in the substrate between the source region and the drain region; and
   a gate electrode formed in the trench,
   wherein the gate electrode includes:
     a titanium nitride electrode filling a bottom portion of the trench;
     a metal electrode formed in the trench and over the titanium nitride electrode; and
     a doped polysilicon liner electrode disposed between the titanium nitride electrode and the metal electrode,
   wherein the doped polysilicon liner electrode extends to between a first sidewall of the metal electrode and the source region,
   wherein the doped polysilicon liner electrode further extends to between a second sidewall of the metal electrode and the drain region, and
   wherein the doped polysilicon liner electrode surrounds the first sidewall, the second sidewall, and a bottom portion of the metal electrode.

2. The transistor according to claim 1, further comprising:
   a barrier layer disposed between the doped polysilicon liner electrode and the metal electrode.

3. The transistor according to claim 2, wherein the metal electrode has resistance lower than the titanium nitride electrode, the barrier layer, and the doped polysilicon liner electrode.

4. The transistor according to claim 1, wherein the titanium nitride electrode has a first work function, and
wherein the doped polysilicon liner electrode has a second work function lower than the first work function.

5. The transistor according to claim 1, wherein the titanium nitride electrode has a first work function higher than a mid-gap work function of silicon, and
wherein the doped polysilicon liner electrode has a second work function lower than the mid-gap work function of silicon.

6. The transistor according to claim 1, wherein the metal electrode include a metal-containing material, and
wherein the doped polysilicon liner electrode has a work function lower than the titanium nitride electrode.

7. The transistor according to claim 1,
wherein the doped polysilicon liner electrode is doped with an N-type impurity, and
wherein the doped polysilicon liner electrode has a work function lower than the titanium nitride electrode.

8. The transistor according to claim 1,
wherein the gate electrode is positioned at a level lower than a top surface of the substrate, and
wherein the transistor further includes:
a capping layer over the gate electrode; and
a gate dielectric layer between the gate electrode and a surface of the trench.

9. The transistor according to claim 1, further comprising:
an isolation layer formed in the substrate to define an active region,
wherein the source region and the drain region are formed in the active region and separated from each other, and
wherein the trench is defined in the active region between the source region and the drain region, and extends into the isolation layer.

10. The transistor according to claim 9, further comprising:
a recess region in the isolation layer under the trench; and
a fin region formed in the active region under the trench, wherein sidewalls of the fin region is exposed by the recess region,
wherein the gate electrode covers the fin region, and
wherein the titanium nitride electrode covers a top and sidewalls of the fin region, while filling the recess region.

11. The transistor of claim 1,
wherein the bottom portion of the trench is filled with only a single layer of the titanium nitride electrode.

* * * * *